United States Patent [19]

Bettcher et al.

[11] Patent Number: 4,841,645
[45] Date of Patent: Jun. 27, 1989

[54] VAPOR DRYER

[75] Inventors: H. Dean Bettcher, Santa Clara; Gary D. Bettcher; Galen D. Bettcher, both of Morgan Hill; Ralph D. Bettcher, Santa Clara, all of Calif.

[73] Assignee: Micro Contamination Components Industries, Santa Clara, Calif.

[21] Appl. No.: 130,131

[22] Filed: Dec. 8, 1987

[51] Int. Cl.⁴ ............................................. F26B 21/06
[52] U.S. Cl. ............................................. 34/78; 34/27
[58] Field of Search ................................. 34/78, 77, 27

[56] References Cited

U.S. PATENT DOCUMENTS

| | | | |
|---|---|---|---|
| 4,261,111 | 6/1979 | Rand | 34/78 X |
| 4,348,174 | 9/1982 | Spigarelli | 34/78 X |
| 4,389,797 | 6/1983 | Spigarelli et al. | 34/78 X |
| 4,394,802 | 7/1983 | Spigarelli | 34/78 X |
| 4,558,524 | 12/1985 | Peck et al. | 34/78 |
| 4,628,616 | 12/1986 | Shirai et al. | 34/78 |
| 4,698,915 | 10/1987 | Dickinson | 34/78 X |
| 4,735,001 | 4/1988 | Mishina et al. | 34/78 X |

Primary Examiner—Steven E. Warner
Attorney, Agent, or Firm—Rosenblum, Parish & Bacigalupi

[57] ABSTRACT

A vapor dryer system in which products to be dried are positioned in a tank and immersed in a hot vapor cloud and saturated with hot vapor, which removes water from the surface of the product as the vapor condenses on the surface. The condensate is collected and diverted to preserve the purity of the solvent reservoir. The vapor is formed from a liquid reservoir which is heated by heat transducer means disposed remotely from the tank to minimize the risk of igniting the vapor.

10 Claims, 5 Drawing Sheets

VAPOR DRYER

BACKGROUND OF THE INVENTION

1. Field of the Invention

The present invention relates to equipment for processing electronic device substrates and products, and more particularly to equipment for drying products after cleaning.

2. Prior Art

Electronic device substrates, or products, such as semiconductor wafers for integrated circuits or metallic platters for hard disk memories, are processed through various sequences of steps. Following some steps, the surface of the substrate is cleaned with an appropriate cleaning agent, and then rinsed in deionized water, which should be dried off without leaving streaks, stains, or spots on the product surface.

Products are dried according to one prior art method in spin dryers provided, for example, by the Flurocarbon Company, the F.S.I. Company, or the Semitool Company. Products are loaded coaxially into a rotor, which is supported within a stainless steel bowl. The products are spun at a high RPM within the bowl on an axis which is inclined from the horizontal at an angle of fifteen degrees to prevent adjacent product surfaces from forming a meniscus which could trap water and contaminants. For the axis to be thusly inclined requires that the products be positioned in three dimensions, which makes the product handling process difficult and expensive to automate. Spin dryers typically have a maximum capacity of one boat containing 25 wafers or products, creating a bottleneck in processing lines otherwise processing two boats at a time. The boat spinning mechanism uses moving parts and bearings which can release contaminating particles into the drying chamber and onto the products, or generate electrostatic discharges (ESD) which can damage electronic circuit elements. Boats spinning at a high RPM are difficult to balance and may rattle the products, which is particularly undesirable for fragile gallium arsenide wafers or large disks. To spin off a one micron particle requires a tremendous centrifugal force which is difficult to achieve in a spin dryer. Water may become stagnant while standing for long periods of time in dead end piping systems. The bowl surface maybe glass beaded and heated which aids in drying the water droplets, but provides crevices for trapping particulates which may be shed during expansions and contractions caused by heating and cooling cycles in subsequent drying operations.

To mitigate some of the problems of spin dryers mentioned above, products are sometimes dried in vapor degreasers as shown for example by U.S. Pat. No. 3,375,177 and 4,098,005. However, typical vapor degreasers have been intended for use in heavy industrial settings, and have not been satisfactory for use in semiconductor fabrication clean room environments. K & S Systems provides a vapor degreaser-dryer preceded by a rinser tank using mechanical parts which can introduce contaminants into the vapor degreaser/dryer chamber, and followed by a holding tank, which occupies an undesirably large footprint area in a clean room. Conventional electrically heated vapor degreasers have lacked effective thermal controls, sometimes overheating to ignite combustible solvent vapors. To reduce the risk of fires, some vapor degreasers have used Freon(R) as a solvent. However, Freon(R) and some other solvents contain carbon and organic molecules which tend to stick to substrate surfaces being cleaned. The K & S vapor degreaser heats isopropyl alcohol to 82 degrees centigrade using electric block heaters which present a fire hazard. In a degreaser provided by Delta Sonics Inc., a solvent vapor cloud is condensed by cooling coils using tap water at unregulated temperatures, preventing good control over the temperature and elevation of the vapor cloud. Vapor degreasers having an open top can emit solvents into the atmosphere in contravention of current strict U.S. safety codes.

Most objectionably, in prior art vapor degreaser systems in which solvent is allowed to remain, the used solvent soon becomes dirty, loses its effectiveness, contaminates the clean solvent reservoir, and needs to be replaced frequently (within approximately three hours), decreasing the yield, and increasing the expense, of the product processing system. Reaching a four percent content of water in isopropyl alcohol leaves products with objectionable spots which are difficult to remove by repeating the steps of cleaning and drying with a new batch of clean solvent. Finally, as semiconductor device designers continue minimizing feature sizes, it becomes essential to remove smaller size residues from products.

The remains, therefore, a need for a substrate drying system with better control of solvent purity and better control of solvent vapor cloud temperature and elevation, without using moving parts which could rattle delicate products or introduce particle contaminates or electrostatic discharges, and with reduced danger of combustion. There is also a need for a dryer system occupying a reduced footprint for use in a clean room environment.

SUMMARY OF THE PRESENT INVENTION

It is therefore an object of the present invention to provide a vapor dryer system capable of maintaining the solvent reservoir and vapor cloud at a high level of purity, and capable of providing a solvent vapor cloud at a controlled temperature, density, and position, with reduced danger of combustion.

It is also an object to provide a system for drying products with fewer particles of a smaller size for fabricating 1 micron or smaller geometry devices. It is another object to provide a product dryer system for drying an increased number of products, which are conveniently loadable using an economical two-axis conveyer mechanism, using a minimum of mechanical parts and movements.

It is a further object to provide a system which occupies a reduced footprint area in, and is maintainable from outside of, a clean room environment.

The present invention achieves these and other objects by providing a vapor dryer in which used condensed solvent is diverted, collected, and removed to preserve the purity of the solvent reservoir. The invention minimizes the risk of combustion by using a remote heater to control the temperature of a heat transfer medium, such as ethylene glycol, which is passed through a heat exchanger to boil a solvent to form a vapor cloud. The invention uses a cooling medium at a controlled temperature to control the density and elevation of the vapor cloud. Carriages having a capacity of holding two boats with quantities of 25 products each are lowered by a pneumatically operated robot arm moving in two dimensions into the dryer chamber. The controlled temperature dense vapor cloud condenses on, and within one or two minutes purges moisture from, the products, which are then lifted above the vapor cloud into a cooling zone and dry within another minute. All of the system surfaces in contact with the solvent are made of non-flammable and non-contaminating materials such as electro-polished stainless steel, quartz, or Teflon (R). Fiber-optic sensors are used with the stainless steel tank embodiment, or proximity sensors may be used with a quartz tank embodiment, to avoid having electric currents in the vapor environment. A halon fire suppression system is also preferably provided for added safety. The design has a reduced foot print and can be bulk-headed to a clean room chase allowing most routine maintenance to be performed from outside the clean room.

DETAILED DESCRIPTION OF THE PREFERRED EMBODIMENTS

The present invention comprises a vapor dryer tank including condensate diversion means; a liquid solvent reservoir; and heating means including a heat transducer remote from the tank for heating liquid solvent from the reservoir to form a hot vapor cloud in the tank.

The invention operates with a solvent, preferably isopropyl alcohol (ISO or IPA) heated to a rapid boil. Since isopropyl alcohol vapor has a flash point of around 80 degrees C., it is important to avoid any possibility of igniting the vapor cloud.

All of the system surfaces in contact with liquid or vaporized solvent are preferably coated with Teflon (R) and are made of non-contaminating materials such as plastic, quartz, or preferably 316L stainless steel with an electro-polished finish.

Figure 1:
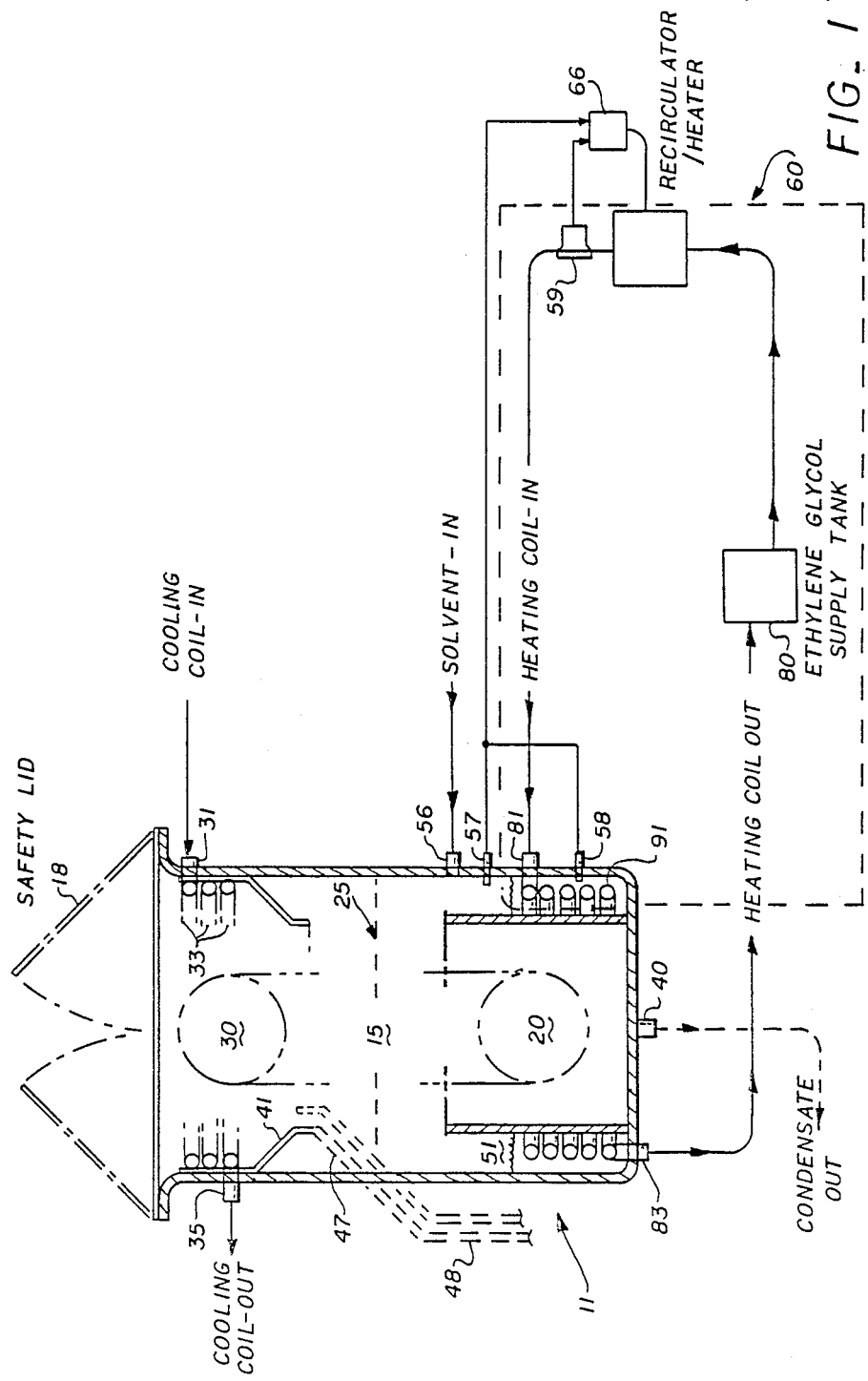
FIG. 1 shows an elevational cross-section of one embodiment of the vapor dryer tank, and shows schematically the elements of a system controller, heater, and heat exchanger for heating solvent to form a vapor cloud.

Referring to FIG. 1, the invention in a preferred embodiment comprises a tank 11 with an inner chamber 15 which confines a solvent vapor cloud at a controlled temperature, density and elevation, and admits products to be dried. Chamber 15 includes saturating and heating zone 20 and drying and cooling zone 30, respectively below and above temporary boundary line 25, which is understood to move depending upon the vapor cloud elevation. Products are supported on support means, not shown, which may be a "boat" and a simple robot arm as are well known in the art. The tank 11 may be square, rectangular, circular, or whatever shape is suitable for surrounding the intended products. Typical tank dimensions are around 24" high by 22" wide by 19" deep. Liquid solvent is introduced through solvent inlet 56 into reservoir 51 in tank 11, and boiled by heating means 60 heat exchanger 91, which is submerged in reservoir 51. It is not necessary for the solvent reservoir 51 to entirely surround the chamber 15. Heat transducer 70 preferably heats ethylene glycol. The preferred embodiment uses a sensor 59, FIGS. 1 and 8, to measure the temperature of the fluid heat transport medium and hence of the liquid solvent in reservoir 51, and uses optical sensors 57 and 58 at different levels in the reservoir to detect the presence or absence of liquid, to thereby indicate to controller 66 whether more solvent should be introduced, the elevation of the vapor cloud, and hence the correct level for the robot arm holding the boat(s) and products. Controller 66 may be a microprocessor available from any of various manufactures.

The heat exchanger heating coils 91 boil solvent from reservoir 51, creating a hot vapor cloud in saturating and heating zone 20 which saturates, and condenses on, products in position 20. The products' remaining water is purged by the condensation, which is thereby contaminated. Hot vapor rises and also condenses on cooling coils 33, which conduct a cooling medium (preferably ethylene glycol) at a set temperature. Cooling coils 33 are preferably ½" diameter stainless steel, quartz, or Teflon (R) tubing.

The tank top may be closed with a safety lid 18 as shown in FIG. 1. However, upper cooling zone 30 provides a "ceiling" holding down the cloud, and thereby largely eliminates the need for a lid. Preferably, no lid is used, because mechanical hinge parts of a lid could introduce particle contaminants. Instead, the tank is operated with its top open to the atmosphere.

To prevent used and condensed solvent from returning to, and contaminating, the clean solvent in reservoir 51 and hence contaminating subsequently dried products, condensate dripping from coils 33 over peripheral solvent reservoir 51 is directed by gutter 41 inward for removal through an isolated central drain 40. Rather than directing cooling coil condensation towards bottom center drain 40, gutter 41 may be provided with a lip 47 and a drain conduit 48 as shown in dotted outline in FIG. 1.

Figure 2:
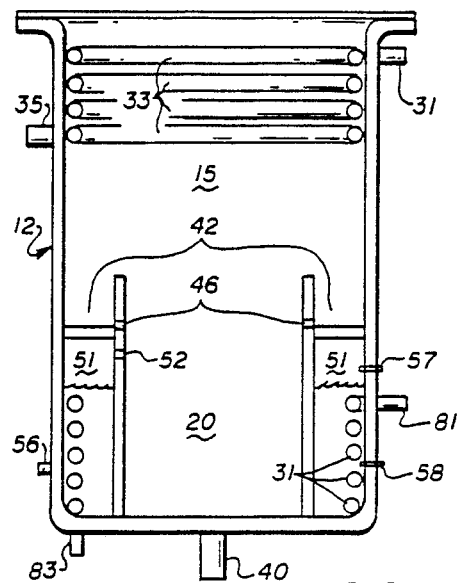
FIGS. 2, 3 and 4 show elevational cross-sections of second, third and fourth embodiments of the vapor dryer tank of the present invention.

FIG. 2 shows an alternate embodiment of the invention using tank 12, in which cooling coil 33 condensate drippings over solvent reservoir 51 are caught by a roof 42 with inside drains 46. Reservoir 51 injects vapor through reservoir wall passage 52 into chamber 15.

Figure 3:
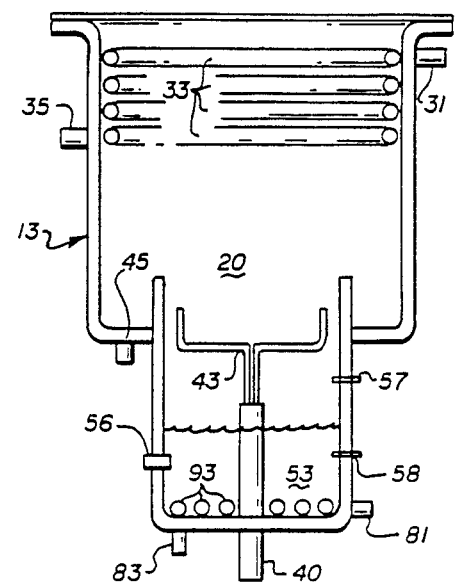

Alternatively, as shown in FIG. 3, the invention may be provided in an embodiment with a tank 13 having a centrally disposed solvent reservoir 53 and heat exchanger 93 with a Y-shaped drain 43, preferably made of stainless steel, to catch product drippings, and a peripheral gutter 45 to catch cooling coil 33 drippings.

Figure 4:
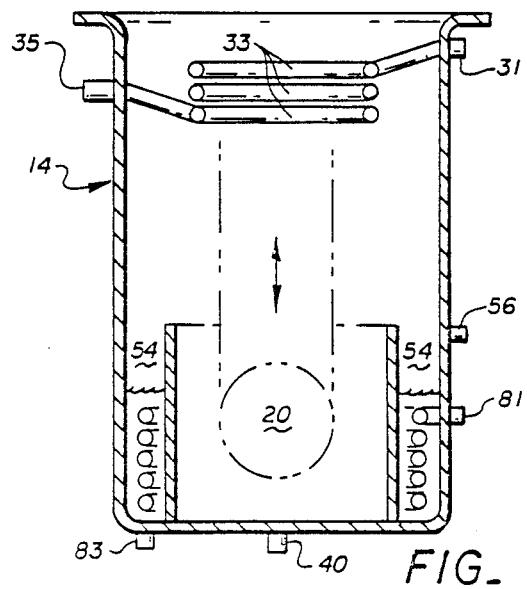

FIG. 4 shows another embodiment of the invention using a tank 14 with a solvent reservoir 54 laterally offset from areas vertically beneath cooling coils 33. In this embodiment, all condensate drippings are diverted through center drain 40.

Figure 5:
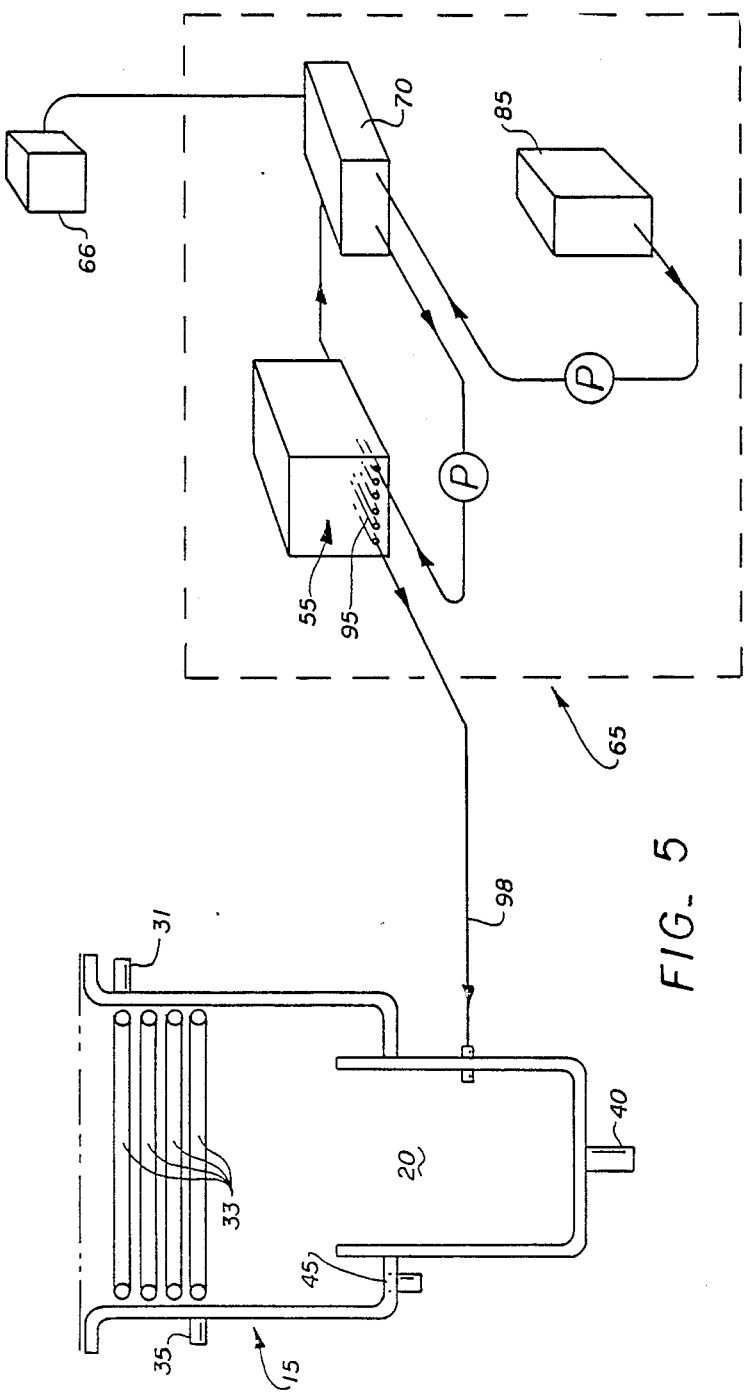
FIG. 5 shows the invention in a fifth embodiment with a reservoir and heat exchanger remote from the tank.

Alternatively, as shown in FIG. 5, the invention may embody heating means 65 with heat exchanger 95 included in a liquid solvent reservoir 55 remote from tank 15. Conduit 98 injects solvent vapor through inlet port 97 to charge saturation heating zone 20.

Operation

Following a step of rinsing in a one to ten gallon per minute flow of deionized water in a rinse tank (not shown and not claimed as an element of the invention), one or two boats each holding a batch of twenty-five products are picked up by a robot arm (needing only to move vertically and laterally along the fab line bench, not shown) and carried to a position above the vapor dryer tank 11, 12, 13, 14 or 15. The robot arm, boats, and products are lowered into the chamber until the substrates are immersed in the vapor saturation zone 20, where they are held, saturated and heated to a high temperature for approximately two minutes. Then, the substrates are lifted into cooling upper zone 30 and remain about 30 seconds, which is sufficient to dry the products completely.

The vapor dryer system uses solvent at a rate of typically one gallon per hour. Used and contaminated solvent is collected by to condensate diversion means 40–48 and discharged via drain line 99 storage container 110. Storage container 110 is preferably constructed of 316L stainless steel, with a port 111 large enough to permit hand cleaning of its interior, and has a capacity of at least one eight hour shift's consumption, i.e. eight to ten gallons, for example.

The vapor dryer system as described above is preferably used as shown in FIG. 6 with a solvent purification and recovery system 100 which purifies IPA for reuse.

Solvent condensate is conducted through purification system 100 by electropolished 316L seamless stainless steel tubing preferably having an overall diameter of one-half inch for the IPA, or an overall diameter of one-quarter inch for the N2. Valves 44, 109, 112, 113, 114, 125, 127, 128, 141, 143, 145, 182, and 184 are one-half inch 316 stainless steel manual ball valves, such as are available from the Whitey Company. Valves 115, 116, 117, 119, 132, 133, 134, 135, 136, 137, 138 and 139 are one-half inch 316L stainless steel automatic valves such as Nupro part number SS-8BK-IC. Pressure gauges 118, 124 and 168 are made of stainless steel and have a measurement range of 0 to 120 PSI.

From storage container 110, condensate is pumped by an explosion-proof electric or pneumatic pump 120 at at least 60 PSI to 100 PSI at a minimum flow of three gallons per minute through either valve 132 to mole sieve 130A or through valve 133 to mole sieve 130B. Pump 120 should have all condensate-contacting parts coated with Teflon (R). A suitable air-operated pump is available from the American Pump Company, Springfield, Mass.

Duplicate mole sieve cans 131A and 131B are constructed from 316L stainless steel and able to withstand a vacuum of one Torr or a pressure of 100 PSI, and a temperature of 300 degrees C. The sieve cans have screens 131 on each end to contain mole sieve beads. The sieve can 131A, 131B inlet and outlet flow distribution patterns are critical to the operation of purification system 100. A suitable mole sieve can, having a 12 inch diameter, 24 inch length and one-half inch NPT inlet and outlet, is available from High-Tech Manufacturing Services, Vancouver, Wash. The mole sieve cans 132A and 132B are each filled with one cubic foot of three angstrom mole sieve beads, available in the form of one sixteenth inch pellets from the Union Carbide Corporation, which remove down to fifty parts of three angstrom water particles per million parts of isopropyl alcohol.

From mole sieve 130A or 130B condensate optionally passes through valve 136 or 137, respectively, to a water monitoring system 140 which indicates the amount of water remaining in the solvent. The vapor dryer system should not be operated with a content of more than two percent water in the solvent. Water monitor 140 may be an inline process control density meter available from the Metler Company of Hightstown, N.J.

Next, the sieved and optionally water-content monitored solvent is passed through ion exchange resin can 152, containing preferably one cubic foot of ion exchange resin 150, which removes chlorine, sodium, potassium, other heavy metals, metallics and ion contamination from the solvent. Ion exchange resin 130 should be a high quality semiconductor grade mixed bed ion exchange resin of the same type used in de-ionized water purifying or polishing beds. A suitable ion exchange resin is NRW-37C type 1 resin available from the Puralife Company. Ion exchange can 152 may be of the same type as the mole sieve cans 132A and 132B.

Following the ion exchange resin, the solvent is passed through a coarse prefilter 160 preferably rated at 0.6 microns, having a 7.4 square foot filter area ten inches long and constructed of polypropylene with silcon O-rings, such as part number CN06-010-01 from the Millipore Corporation. The coarse filter housing 162 is preferably a type PS-1 housing, 316 SS, twelve inches long, available from the Millipore Company.

Following coarse filter 160, the solvent is passed through a final "stack filter" 170, preferably a 0.1 micron filter having a 2.2 square foot area imposing a 5 PSI pressure drop at two gallons of IPA per minute at 22 PSI, made of PVDF, PTFE or ECTFE Teflon (R) polymer compound membrane which does not shed when subjected to isopropyl alcohol, such as the wafer guard F-40 cartridge available from the Milipore Corporation. The final stack filter housing 172 is of 316 stainless steel, rated at 150 PSI and having one half inch national pipe thread inlet and outlet ports, as available from the Millipore Corporation.

The solvent then passes via conduit 175 to flow meter 180 having a zero to 400 cubic centimeters per minute flow capacity, and all wetted parts coated with Teflon (R), such as part number 961-12410-1 from the Mace Company. From flow meter 180, solvent flow can be directed either to the tank reservoir 50 or to the storage container 110 through valve 182 or 184, respectvely, controlled by controller 66 (FIG. 1) in response high and low level tank sensors 57 and 58.

The solvent purification and recovery system 100 is serviced (preferably once a week) by closing valves 132 and 136 on sieve 130A, and opening valves 133 and 137 on sieve 130B, or vice versa, to substitute the recently unused mole sieve 130A or 130B for the recently used mole sieve 130B or 130A. The used sieve is regenerated by opening valve 135 or 134, respectively, and activating vacuum pump 121 to apply approximately one hundred and fifty pounds of vacuum to the mole sieve. Vacuum pump 121 must provide a base pressure of at least one Torr at a pump rate of at least one cubic foot per minute, such as the model D2A available from the Leybold-Hergeus Company. Oil trap 122, of a type such as an absorption filter suitable for assuring that no oil backstreams from the vacuum to the mole sieves 130A and 130B, is available from Leybold-Hergeus.

This vacuum removes any IPA remaining in the sieve 130A or 130B. However, water remains packed so tightly within the sieve that it must be dried out by opening valve 138 or 139 and introducing N2, from supply 124, heated to approximately 300 degrees Centigrade by heater 126, which may be the hot water model "PF" pure flow filter for heating about 100 watts per inch for 24 inches to a maximum temperature of 800 degrees F., or a similar heater available from the Chromalox Company. Nitrogen filter 129 is preferably an in-line filter with one quarter inch compression fittings such as the 0.05 micron wafer guard available from the Milipore Corporation.

Hot dry N2 applied for approximately two hours evaporates and purges the water remaining entrapped in the holes of the sieve 130A or 130B. The ion exchange resin 150 has a long(er) lifetime and does not need to be serviced as frequently.

The alcohol purification and recovery system of the present invention purifies alcohol to less than fifty parts of water per million parts of IPA, which is substantially cleaner than commercially available electronic grade IPA. Therefore, even "fresh" IPA is preferably introduced into a very clean storage container 110 and driven through the a sieve 130A or 130B, and filters 160 and 170, before being used in the vapor tank for drying substrates. Instead of isopropyl alcohol, it is possible to use various other solvents such as Freon (R) or methanol if solvent compatibility problems with O-ring and fitting materials, and with the ion exchange resin 150, are addressed. The sieves would work as well with other solvents than isopropyl alcohol.

The solvent recovery system 100 may be used with up to four IPA dryers to dry substrates.

Mole sieve material regeneration requires heating the sieve can 131A or 131B to a temperature well above the flash point of IPA, so the system is preferably provided with ultraviolet sensors, and a multiple halon discharge fire extinguisher system of a suitable size, for example from the Fire Boy Company or from the NF Fire Company.

The system is also preferably provided with an IPA detector suitable to detect IPA leaks in the range of 500 to 10,000 parts per million, as available for example from Sierra Monitor Corporation.

Figure 6:
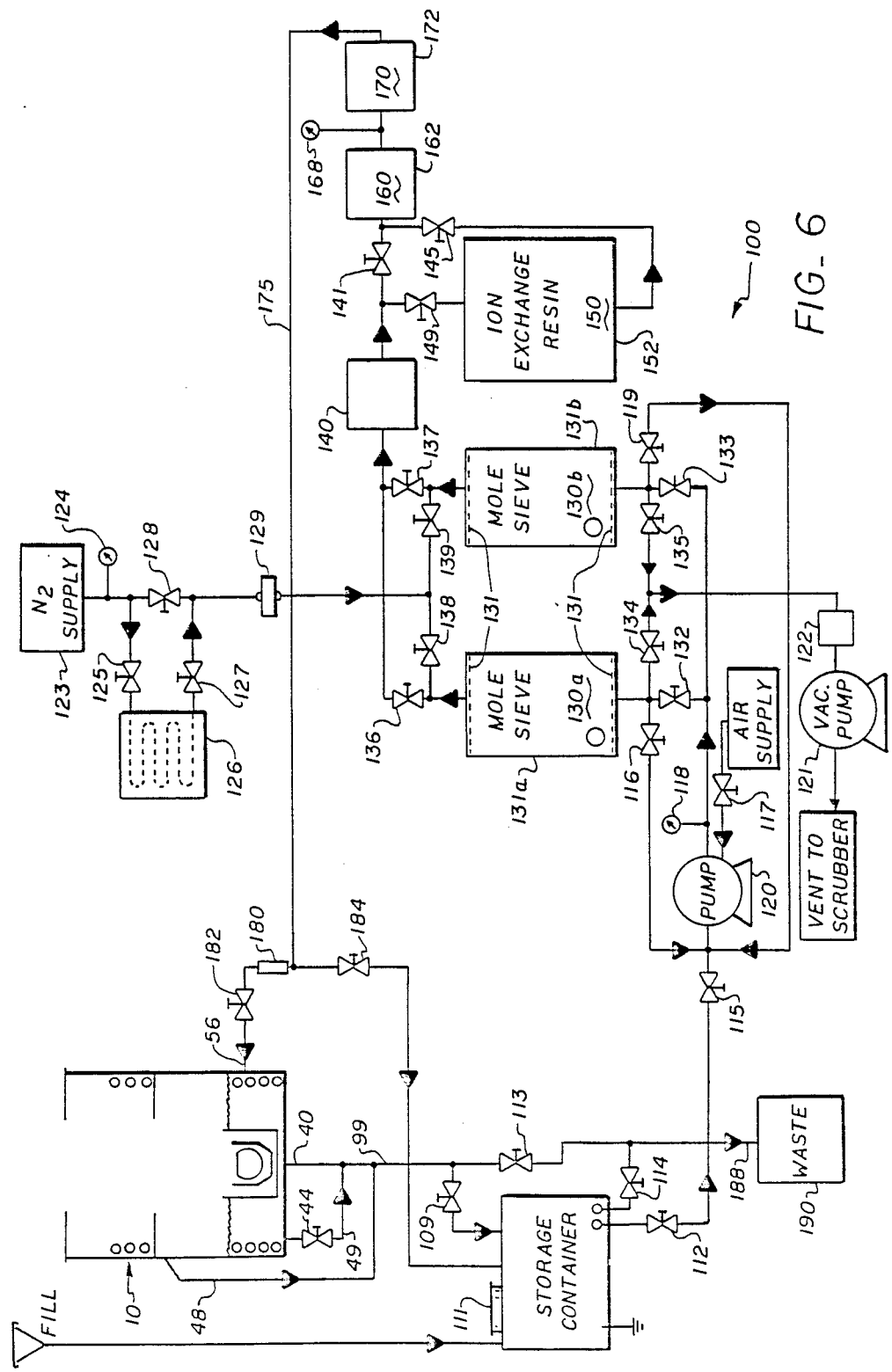
FIG. 6 shows a solvent purification and recovery system preferably used with any of the illustrated embodiments of vapor dryer tanks of this invention.
Figure 9:
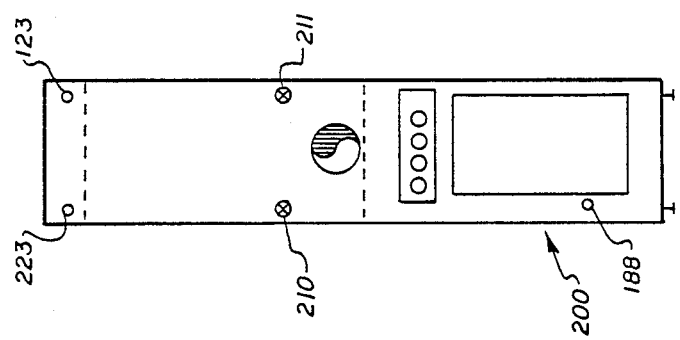
FIG. 9 shows a rear view of the cabinet of FIG. 7.
Figure 8:
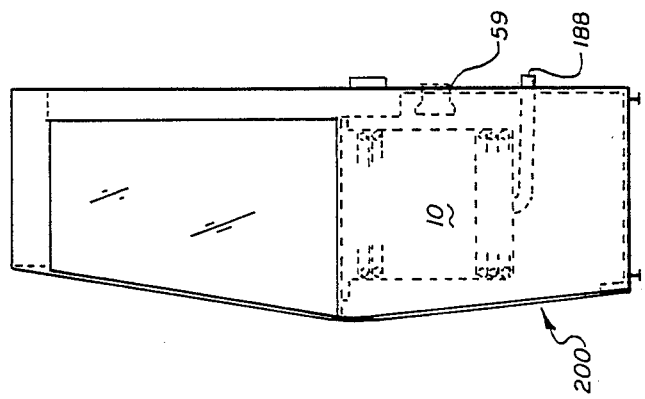
FIG. 8 shows a side elevational view of the cabinet of FIG. 7.
Figure 7:
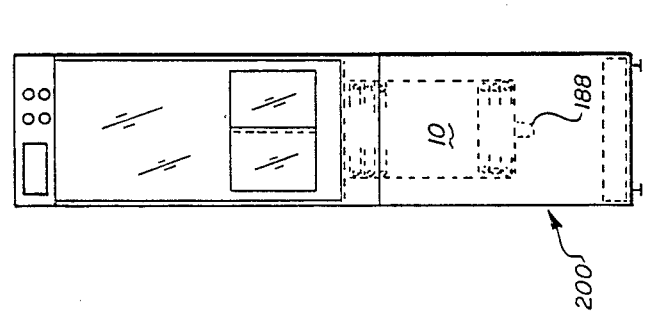
FIG. 7 shows a front elevational view of a cabinet preferably housing the present invention with secondary containment.

FIGS. 7, 8 and 9 illustrate front, side and rear elevational views of a cabinet 200 preferably used to house the tank 10, reservoir 50, heating means 60, solvent purification system 100, controller 66 and fire prevention systems 210 and 211 and leakage detection systems of the present invention. Cabinet 200 has a base made of stainless steel and a hood made of PVC. Automated pass-through doors may be used for substrates to enter from the preceding (typically rinser) station and to exit to the succeding processing station. Cabinet 200 has inlet 123 for the N2 supply and inlet 223 for an electrical supply for controller 66 and other devices as necessary, and an outlet 188 for discharging condensate to waste drum 190 (FIG. 6). Cabinet 200 preferably further features a fire damper and secondary containment.

The invention has been illustrated in preferred embodiments, of which modifications and adaptations within the scope of the invention will occur to those skilled in the art. The invention is limited only by the scope of the following claims.

What is claimed is:
1. A product drying system comprising:
   tank means including
      means forming an interior chamber having a top opening for receiving products,
      an upper-portion forming a drying and cooling zone,
      a lower portion forming a saturating and heating zone within which a hot vapor cloud is to be formed, and
      condensate diversion means disposed within said lower portion for collecting substantially all of the condensation formed by the cooling of said vapor cloud and for discharging said condensation from the tank means so that said condensation does not contaminate said vapor cloud;
   cooling means for cooling said upper portion to prevent said vapor cloud from rising through said opening; and
   means for creating a hot vapor cloud in said lower portion;
   whereby products disposed within said chamber and immersed in said vapor cloud become saturated with hot vapor which condenses on the surface thereof and removes water as it drips therefrom to be collected and discharged from said tank means by said condensate diversion means.

2. A drying system as recited in claim 1, and further comprising a solvent purification system including:
   means for receiving said condensation from said diversion means;
   means for removing impurities from said condensation to produce purified solvent; and
   means for controllably returning said purified solvent to said reservoir means.

3. A drying system as recited in claim 2, wherein said means for removing impurities includes means for removing water in excess of 50 ppm from said condensation.

4. A drying system as recited in claim 2, wherein said means for removing impurities includes mole sieve means for removing water and ion exchange resin means for removing metallic ions from said condensation.

5. A drying system as recited in claim 1 wherein said means for creating a hot vapor cloud comprises:
   reservoir means for holding liquid solvent,
   heat exchanger means disposed in said reservoir,
   a fluid heat transport medium circulating through said heat exchanger, and
   heat transducer means, disposed remotely from said tank means, for heating said fluid heat transport medium.

6. A drying system as recited in claim 5 wherein said reservoir means is disposed remotely from said tank means and wherein said means for creating a hot vapor cloud further comprises nozzle means in fluid communication with said reservoir means and extending through the wall of said tank means for injecting vapor from said remote reservoir means into said lower portion.

7. A drying system a recited in claim 5 wherein said reservoir means is disposed in said tank means, and wherein said tank means further comprises means for isolating said reservoir means from said condensate diversion means.

8. A drying system as recited in claim 7 wherein said cooling means is disposed inside said upper portion and said reservoir means is offset laterally from areas vertically beneath said cooling means and from areas vertically beneath said saturating and heating zone.

9. A drying system as recited in claim 7 wherein said condensate diversion means includes roof-gutter means over parts of said reservoir means which are vertically beneath said cooling means, and over parts of said reservoir means which are vertically beneath said saturating and heating zone.

10. A drying system as recited in claim 7 wherein said means for isolating comprises second tank means including a wall disposed within said lower portion between the vertical centerline of said chamber and the lateral periphery of said chamber.

* * * * *